United States Patent [19]

Chu et al.

[11] Patent Number: 5,216,667
[45] Date of Patent: Jun. 1, 1993

[54] SIMULTANEOUS BIDIRECTIONAL TRANSCEIVER

[75] Inventors: William M. Chu, Hyde Park; Andrew Z. Muszynski, West Hurley, both of N.Y.

[73] Assignee: International Business Machines Corporation, Armonk, N.Y.

[21] Appl. No.: 705,486

[22] Filed: May 24, 1991

[51] Int. Cl.⁵ .................. H04L 5/14; H04B 3/03
[52] U.S. Cl. ........................ 370/24; 370/85.1; 375/7
[58] Field of Search .......... 370/24, 25, 27, 33, 370/34, 36, 87, 85.1; 375/7; 379/405

[56] References Cited

U.S. PATENT DOCUMENTS

| | | | |
|---|---|---|---|
| 4,162,371 | 7/1979 | Belforte | 370/27 |
| 4,516,236 | 5/1985 | Hadziomerovi | 370/27 |
| 4,573,168 | 2/1986 | Henze et al. | 375/36 |
| 4,604,740 | 8/1986 | Gandini et al. | 370/27 |
| 4,638,473 | 1/1987 | Cooperman et al. | 370/27 |
| 4,646,319 | 2/1987 | Engel et al. | 375/7 |
| 4,649,548 | 3/1987 | Crane | 375/7 |
| 4,698,800 | 10/1987 | Cavaliere et al. | 370/24 |
| 4,713,827 | 12/1987 | Lauffer et al. | 375/7 |
| 4,731,820 | 3/1988 | Kanno et al. | 375/7 |
| 4,756,006 | 7/1988 | Rickard | 375/7 |
| 4,837,736 | 6/1989 | Donaldson et al. | 364/900 |
| 4,852,160 | 7/1990 | Kiko et al. | 379/405 |
| 4,912,724 | 3/1990 | Wilson | 375/7 |
| 4,920,532 | 4/1990 | Wroblewski | 370/85.1 |
| 4,931,672 | 6/1990 | Khan | 307/475 |

FOREIGN PATENT DOCUMENTS

| | | | |
|---|---|---|---|
| 1143813 | 3/1983 | Canada | 370/24 |
| 1233531 | 3/1988 | Canada | |
| 0405743 | 2/1991 | European Pat. Off. | |
| 0090051 | 4/1987 | Japan | 370/24 |
| 0564728 | 7/1977 | U.S.S.R. | 370/24 |
| 1408537 | 7/1988 | U.S.S.R. | 370/24 |

OTHER PUBLICATIONS

A. Y. Chang and P. J. Pandya, "Simultaneous Bidirectional Transceiver Circuit," IBM Technical Disclosure Bulletin, vol. 23, No. 4, pp. 1435–1427, Sep. 1980.

Primary Examiner—Douglas W. Olms
Assistant Examiner—Hassan Kizou
Attorney, Agent, or Firm—Robert L. Troike; Scott A. Horstemeyer

[57] ABSTRACT

A digital data transceiver comprises a conventional push-pull driver and a novel receiver. The transceiver can drive data to and simultaneously receive data from a transceiver of like kind via the same communication line. A series resistor is situated between the driver's output and the communication line. The resistor has equivalent resistance to the characteristic impedance of the line in order to prevent undesirable reflections on the line. In the receiver, the driver's output is divided in half by a resistor voltage divider for input to a differential current mechanism. The differential current mechanism has a differential current switch and a feedback circuit. The differential current switch compares the signal levels at both ends of the series resistor to derive an output for the receiver. The feedback circuit provides feedback to the differential current switch to increase the noise margin.

2 Claims, 2 Drawing Sheets

SIMULTANEOUS BIDIRECTIONAL TRANSCEIVER

TECHNICAL FIELD

The present invention relates generally to digital communications and, more particularly, to a bidirectional bus configuration for simultaneous digital data communications.

BACKGROUND ART

In a conventional digital data communications system, one or more data buses communicate information among the various subsystems. Each data bus commonly has eight, sixteen, thirty-two, sixty-four or even more individual data paths, which are essentially wires or semiconductor throughways.

Additionally, a data bus can be unidirectional or bidirectional. In a unidirectional configuration, the data bus is adapted to transfer information in only one direction. Often, a driver resides on one end of the data bus, while a compatible receiver resides on the other end.

In conventional implementations, the driver traditionally needs more power to operate than the receiver. Consequently, designers concerned with power consumption often focus upon the design of the driver. In order to reduce power consumption and to increase performance, "push-pull" drivers are commonly implemented, which are well known in the art.

A variety of push-pull drivers are commercially available from the various semiconductor manufacturers. For example, a model Am26LS31 push-pull driver is presently available from Advanced Micro Devices, Inc., U.S.A. As a further example, a model SN74S240 push-pull driver is readily available from Texas Instruments, Inc., U.S.A.

In a bidirectional configuration of a data bus, the data can be transmitted in both directions. Bidirectional configurations are often employed to reduce the number of interconnections between the data bus and input/output (I/O) devices. Essentially, the data bus serves as a "party line," permitting communication among various subsystems, including I/O devices, via the shared data bus. The bidirectional data bus has both a driver and a receiver, or collectively a "transceiver", at each end of the data bus. U.S. Pat. No. 4,573,168 to Henze et al. discloses a model Am26L532 driver and a model Am26L532 receiver used in combination as a transceiver at the ends of a bidirectional data bus. Furthermore, U.S. Pat. No. 4,713,827 to Lauffer et al. shows a bidirectional transceiver used on a data bus.

Furthermore, each data path of a conventional data bus essentially exhibits the characteristics of a transmission line. Accordingly, a characteristic impedance $Z_0$ can be specified to characterize any data bus. The characteristic impedance $Z_0$ is defined during design and manufacture by the choice of conductive and insulative materials, spacing of conductors, and other factors influencing the electrical characteristics of the data bus.

When information is transmitted over a data bus between two subsystems, it is extremely important to prevent "ringing" of the data bus, i.e., to minimize noise generated by undesirable electrical reflections from the driver and receiver. The ringing undesirably reduces the noise margin and affects the net performance. When a driver is in operation, an electrical termination or sink to a reference node, typically ground, optimally resides at the receiver to eliminate these reflections. To this end, the characteristic impedance $Z_0$ of each transmission line on the data bus is typically matched with a substantially equivalent load impedance connected to the data bus and a reference mode. Most data buses have transmission lines with characteristic impedances $Z_0$ ranging between fifty ohms and two hundred ohms.

Among others, U.S. Pat. No. 4,713,827 to Lauffer et al. and U.S. Pat. No. 4,912,724 to Wilson disclose a bidirectional bus arrangement with the use of a matching resistor. The resistor effectively terminates the line during transmission to prevent reflections.

Although conventional bidirectional data bus arrangements reduce I/O connections and other computer hardware, the bus arrangements can compromise the speed of data interactions among computer subsystems. Specifically, they generally do not permit the simultaneous exchange of digital information, and those arrangements that do, do not permit simultaneous communications in a power efficient manner and with a sufficient noise margin.

An article entitled, "Simultaneous Bidirectional Transceiver Circuit," by A. Y. Chang and P. J. Pandya, which appeared in the *IBM Technical Disclosure Bulletin*, Vol. 23, No. 4, pp. 1435-1437, Sep. 1980, illustrates a bidirectional transceiver circuit which is capable of simultaneously transmitting and receiving digital information over a single wire. A specialized driver having a current source is employed.

However, the disclosed transceiver undesirably draws a ground current which can generate noise and disturb other nearby receivers, (2) dissipates high power (average power consumption is about 105 milliwatts), and (3) exhibits sensitivity to switching noise, i.e., noise generated when the data switches between its states, for example, between a logic high ("1") and a logic low ("0"), or vice versa.

U.S. Pat. No. 4,698,800 to Cavaliere et al. discloses a simultaneous bidirectional transceiver circuit which is very similar to the transceiver circuit disclosed in the foregoing article. In fact, A. Y. Chang is co-author of the article and co-inventor of the patent. The patent appears to be an improvement on the transceiver circuit disclosed in the article. More specifically, the patent discloses a transceiver circuit which uses less power (about 75 milliwatts average power).

However, a specialized driver having a current source is still employed in the patented transceiver circuit. Moreover, the special driver of the transceiver circuit uses much more power than a conventional push-pull driver. Finally, the noise margin is still not ideal.

Thus, a need exists in the industry for a bidirectional data bus transceiver arrangement which provides for simultaneous communications at low power and with a sufficient noise margin.

DISCLOSURE OF INVENTION

The foregoing and other objects, features and advantages of the invention will be apparent from the following more particular description of (a) preferred embodiment(s) of the invention, as illustrated in the accompanying drawing(s).

The present invention is a simultaneous bidirectional bus transceiver and method thereof. A bidirectional bus transceiver is situated at each end of communication line, for instance, a data or control line in a computer system. The bidirectional bus transceiver has a driver and a receiver.

At one end of the communicaiton line, a local transceiver, via its associated driver, sends logic signals to a remote transceiver at the other end of the communication line. Simultaneously, the local transceiver, via its associated receiver, receives logic signals from the remote transceiver.

In accordance with the present invention, a differential current switch is situated at the receiver of each transceiver. The differential current switch is configured to compare the signals at opposing ends of a resistor, having resistance equivalent to the communication line and connected to the end of the communication line. By comparing the signals at the opposing ends of the resistor, the differential current switch can derive an output in accord with the logic state of the remote driver.

FEATURES AND ADVANTAGES OF THE INVENTION

The present invention overcomes the deficiencies of the prior art, as noted above, and further provides for the following additional advantages.

The present invention provides for the transmission and simultaneous reception of digital data on the same data path, such as a single wire. Needless to say, the digital signal communicated along the path need not be actual data, but may be, for example, a control signal or some other digital signal.

The present invention reduces the number of I/O interconnections and related hardware thereby reducing cost.

The present invention provides for simultaneous bus communications at low power. To this end, conventionally available push-pull drivers may be used in accordance with the present invention. The conventional push-pull drivers operate at low power levels relative to other drivers.

As a result of feedback circuit in the novel receiver of the present invention, the noise margin is increased and logic states can be communicated at lower power levels.

BRIEF DESCRIPTION OF THE DRAWINGS

The present invention, as defined in the claims, can be better understood with reference to the text and to the following drawings.

BEST MODE FOR CARRYING OUT THE INVENTION

Figure 1:
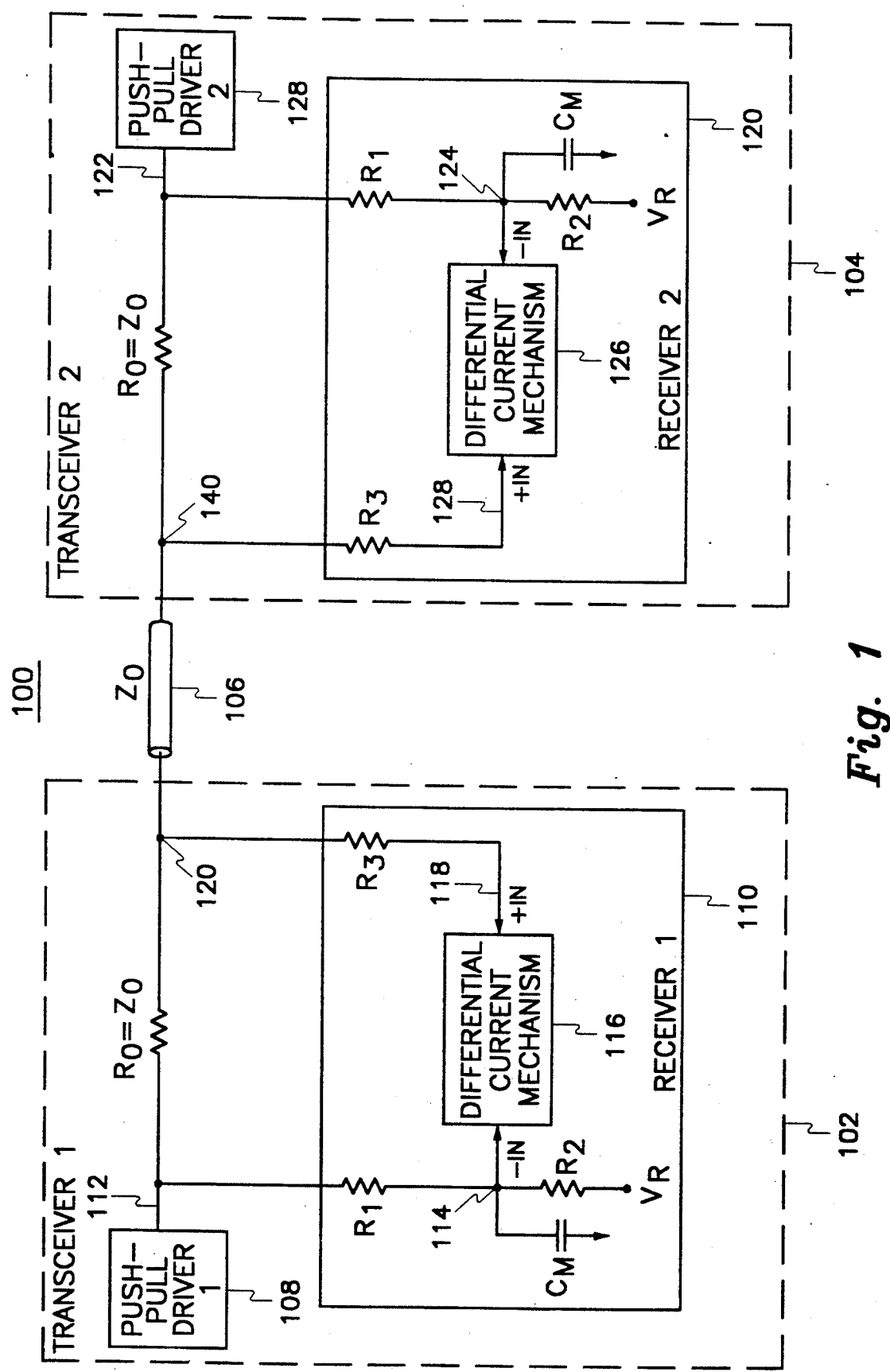
FIG. 1 illustrates a high level block diagram of a simultaneous bidirectional bus transceiver having a push-pull driver, in accordance with the present invention.

FIG. 1 illustrates a high level block diagram of a bidirectional bus transceiver 102 in communication with a bidirectional bus transceiver 104. In accordance with the present invention, the transceivers 102 and 104 can drive and receive data simultaneously through the same data path 106, having a characteristic impedance $Z_0$.

Transceivers 102 and 104 are substantially the same. Accordingly, the immediate discussion in regard to the construction of transceiver 102 is equally applicable to transceiver 104. Moreover, as shown in FIG. 1, similar reference numerals are utilized for identification of components.

Transceiver 102 comprises a conventional driver 108 and a novel receiver 110. In the preferred embodiment, the driver 108 is a push-pull driver because of its desirable efficient power characteristics. A resistor $R_0$ having impedance $Z_0$ is connected in series with the driver 108 and the data path 106 for the purpose of preventing undesirable reflections (ringing) on the data path 106. The foregoing components, in whole or in part, of the transceiver 102 could be situated on an integrated circuit (IC), if desired.

In the preferred embodiment, the push-pull driver 108 can drive output voltages of either +0.5 volts for a logic high or −0.5 volts for a logic low onto a line 112. In the receiver 110, the output voltage is divided in half by a voltage divider comprised of resistors $R_1$ and $R_2$, having equal resistance values, in order to provide a voltage at node 114 of either +0.25 v or −0.25 v.

A differential current mechanism 116 provides the output of the receiver 110 by comparing the voltage at node 114 with the voltage at the end of the data path 106, via and slightly modified by a resistor $R_3$. The functionality of the differential current mechanism 116 can be described succinctly as follows. If the voltage at node 114 (−IN) is greater than the voltage at node 118, then the differential current mechanism 116 will provide a logic low (corresponding with −IN) for the output of the receiver 110. In contrast, if the voltage at node 118 (+IN) is greater than the voltage at node 114, then the differential current mechanism 116 will provide a logic high (corresponding with +IN) for the output of the receiver 110.

A specific implementation of the circuitry in FIG. 1 can described by considering four possible combinations of steady state logic states outputted by the drivers 108 and 128. The logic states as well as the steady state signal response at other locations of the circuitry of FIG. 1 is shown below in Table A.

TABLE A

| TR 1 DRIVER | TR 2 DRIVER | TR 1 RECVR +IN | TR 1 RECVR −IN | TR 2 RECVR +IN | TR 2 RECVR −IN | TR 1 RECVR OUT | TR 2 RECVR OUT |
|---|---|---|---|---|---|---|---|
| +0.5 v | +0.5 v | +0.5 v | +0.25 v | +0.5 v | +0.25 v | HIGH | HIGH |
| −0.5 v | −0.5 v | −0.5 v | −0.25 v | −0.5 v | −0.25 v | LOW | LOW |
| +0.5 v | −0.5 v | 0.0 v | +0.25 v | 0.0 v | −0.25 v | LOW | HIGH |
| −0.5 v | +0.5 v | 0.0 v | −0.25 v | 0.0 v | +0.25 v | HIGH | LOW |

As indicated in Table A, the output of the receiver 110 and 120 in each transceiver 102 and 104 exhibits the same logic level as the push-pull driver in the other transceiver. In other words, the driver at one end of the data path 106 is always in logical phase with the receiver at the other end. Hence, simultaneous communications occur on the data path 106.

In order to further an understanding of the operation of the present invention, a circuit analysis follows for derivation of the table values in Table A.

The resistance of the data path is relatively negligible and thus is not taken into account. Because the transceivers 102 and 104 are essentially identical, the steady state voltages at nodes 118 and 128, which is at the positive inputs (+IN) of respective differential current mechanisms 116 and 126, are essentially equivalent. Furthermore, the voltages at nodes 114 and 124, which is at the negative inputs (−IN) of respective differential current mechanisms 116 and 126, is one half of the output voltage of the corresponding driver 108 or 128.

The heart of the receivers 110 and 120 lies within the differential current mechanisms 116 and 126. The specific circuitry comprising the differential current mechanisms 116 and 126 can take many forms. Any differential current mechanism having the functionality as set forth in this document may be utilized. Note that the discussion that follows is in direct correspondence with the rows of Table A.

When both drivers 108 and 128 are outputting +0.5 v for a logic high, both receivers 110 and 120 should output a logic high for simultaneous communication to occur. In this case, +0.5 v appears at line 118 of transceiver 102 (+IN for transceiver 1) and at line 128 of transceiver 104 (+IN for transceiver 2). Moreover, +0.25 v appears at node 114 of transceiver 102 (−IN for transceiver 1) and at node 124 of transceiver 104 (−IN for transceiver 2). Note that in both transceivers 102 and 104, the voltage at +IN is greater than the voltage at −IN. Based upon the differential currents induced by these voltages, the differential current mechanisms 116 and 126 indicate a logic high, in correspondence with +IN>−IN.

When both drivers 108 and 128 are outputting −0.5 v for a logic low, both receivers 110 and 120 should output a logic low for proper simultaneous communications to occur. In this case, −0.5 v appears at line 118 of transceiver 102 (+IN for transceiver 1) and at line 128 of transceiver 104 (+IN for transceiver 2). Moreover, −0.25 v appears at node 114 of transceiver 102 (−IN for transceiver 1) and also at node 124 of transceiver 104 (−IN for transceiver 2). Note that in both transceivers 102 and 104, the voltage at −IN is greater than the voltage at +IN. Based upon the differential currents induced by these voltages, the differential current mechanisms 116 and 126 indicate a logic low, in correspondence with −IN>+IN.

When the driver 108 outputs +0.5 v for a logic high while the driver 128 outputs −0.5 v for a logic low, the receiver 120 should output a logic high while the receiver 110 outputs a logic low. In this case, 0.0 v appears at line 118 of transceiver 102 (+IN for transceiver 1) and 0.0 v appears at line 128 of transceiver 104 (+IN for transceiver 2). Moreover, +0.25 v appears at node 114 of transceiver 102 (−IN for transceiver 1) and −0.25 v appears at node 124 of transceiver 104 (−IN for transceiver 2). Based upon the differential currents induced by these voltages, the differential current mechanisms 116 and 126 indicate respectively a logic low (−IN>+IN) and a logic high (+IN>−IN).

When the driver 108 outputs −0.5 v for a logic low while the driver 128 outputs +0.5 v for a logic high, the receiver 120 should output a logic low while the receiver 110 outputs a logic high. In this case, 0.0 v appears at line 118 of transceiver 102 (+IN for transceiver 1) and 0.0 v appears at line 128 of transceiver 104 (+IN for transceiver 2). Moreover, −0.25 v appears at node 114 of transceiver 102 (−IN for transceiver 1) and +0.25 v appears at node 124 of transceiver 104 (−IN for transceiver 2). Based upon the differential currents induced by these voltages, the differential current sources 116 and 126 should indicate respectively a logic high (+IN>−IN) and a logic low (−IN>+IN).

Figure 2:
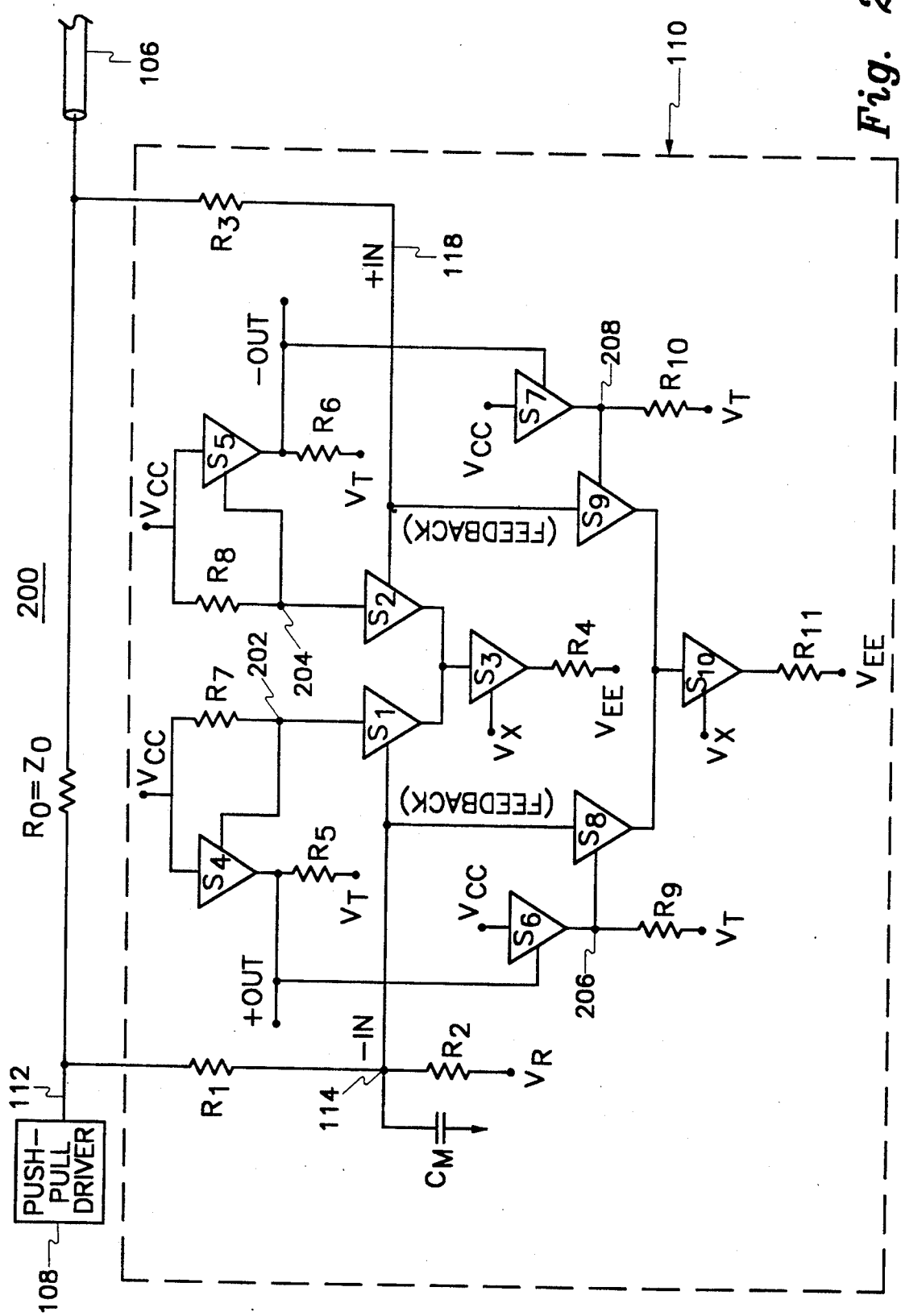
FIG. 2 illustrates a low level block diagram of a novel receiver within the transceiver of FIG. 1, in accordance with the present invention.

FIG. 2 illustrates a low level block diagram of a data receiver 110 within the transceiver of FIG. 1, in accordance with the present invention. The receiver 110 comprises a differential current mechanism 116 having a differential current switch and a feedback circuit.

The differential current switch provides the differential outputs at −OUT and +OUT of the receiver 110 based upon the logic states of the complimentary inputs (+IN, −IN) of the differential current mechanism 116 at nodes 114 and 118. The differential current switch is comprised of switching elements $S_1$–$S_5$ and resistors $R_4$–$R_8$. The switching elements $S_1$–$S_5$ can take many forms, including but not limited to npn transistors, pnp transistors, MOSFETs, or the like.

The differential voltage swing between the inputs +IN and −IN of the differential current mechanism 116 is 0.25 v ($|+IN-(-IN)|$), as can be seen in Table A. With a conventional push-pull driver, the differential voltage swing at the receiver is about 0.5 v. Such a low voltage swing can be too close to the inherent noise of the network. Hence, a compensation circuit should optimally be incorporated to raise the noise margin.

To this end, the feedback circuit is implemented and is comprised of switching elements $S_6$–$S_{10}$ and resistors $R_9$–$R_{11}$. Similar to the switching elements $S_1$–$S_5$, the switching elements $S_6$–$S_{10}$ can take many forms, including but not limited to npn transistors, pnp transistors, MOSFETs, or the like. The feedback circuit essentially feeds current back from the outputs (−OUT, +OUT) of the receiver 110 to the inputs of the differential current switch, thereby effectively increasing the differential voltage levels of the inputs (−IN, +IN) to the differential current mechanism 116. The power feedback essentially provides for a larger, more adequate noise margin by raising the differential voltage levels at nodes 114 and 118. In the preferred embodiment, the feedback circuit effectively raises the differential voltage levels by at least 0.1 v.

With reference to FIG. 2, the differential current switch operates as follows. When both the driver 108 and a remote driver are outputting +0.5 v for a logic high, the receiver 110 should output a logic high.

In this scenario, +0.5 v appears at node 118 (+IN). Moreover, +0.25 v appears at node 114 (−IN). As a result, switching element $S_1$ is turned off, while switching element $S_2$ is turned on. The combination of the switching element $S_3$, the resistor $R_4$, a controlling voltage $V_x$, and a biasing voltage $V_{EE}$ serve as a constant current source, as is well known in the art, for maintaining the current flow through either the switching element $S_1$ or $S_2$. In this scenario, the constant current source maintains constant current through the switching element $S_2$, which is operational as a through-way.

The combination of switching element $S_4$ and resistor $R_5$ as well as the combination of switching element $S_5$ and resistor $R_6$ serve as emitter followers, which is well known in the conventional art. The emitter followers perform a voltage translation and provide better drive capabilities.

Because switching element $S_1$ is turned off, no current flows through resistor $R_7$. The voltage at node 202 is equal to $V_{CC}$. Moreover, because switching element $S_2$ is turned on, the current from the current source flows through resistor $R_8$. The foregoing response creates a voltage drop across resistor $R_8$; therefore, the voltage at node 204 is lower than the voltage at node 202. The voltage levels at nodes 202 and 204 are shifted down through emitter followers $S_4,R_5$ and $S_5,R_6$. Consequently, a high voltage signal appears at +OUT and a low voltage signal appears at −OUT of the receiver 110.

Because in the present scenario the voltage output at +OUT is greater than the voltage output at −OUT, the output of the receiver 110 is defined as a logic high in the preferred embodiment. In other words, in the preferred embodiment, the positive and negative outputs are considered collectively to determine a differential which specifies the overall logic output of the receiver 110. It should be noted, however, that the outputs +OUT and −OUT could be considered independently to determine the logic output of the receiver 110.

When both the driver 108 and a remote driver are outputting −0.5 v for a logic low, the receiver 110 should output a logic low. In this scenario, −0.5 v appears at line 118 (+IN). Moreover, −0.25 v appears at node 114 (−IN). As a result, switching element $S_1$ is turned on to provide a throughway for current, while switching element $S_2$ is turned off.

Now, current flows through resistor $R_7$, not resistor $R_8$. The voltage at node 202 is lower than the voltage at node 204. After a voltage translation by the emitter followers, a lower voltage signal appears at +OUT than at −OUT of the receiver 110, thereby indicating a logic low.

When the driver 108 outputs +0.5 v for a logic high while a remote driver outputs −0.5 v for a logic low, the receiver 110 outputs a logic low. In this case, 0.0 v appears at line 118. Moreover, +0.25 v appears at node 114. As a result, switching element $S_1$ is turned on, while switching element $S_2$ is turned off.

Accordingly, current flows through resistor $R_7$, not resistor $R_8$. The voltage at node 202 is lower than the voltage at node 204. After a voltage translation by the emitter followers, a lower voltage signal appears at +OUT than at −OUT of the receiver 110, thereby indicating a logic low.

When the driver 108 outputs −0.5 v for a logic low while a remote driver outputs +0.5 v for a logic high, the receiver 110 should output a logic high. In this scenario, 0.0 v appears at line 118 and −0.25 v appears as node 114. As a result, switching element $S_1$ is turned off, while switching element $S_2$ is turned on.

Because the switching element $S_1$ is turned off, no current flows through resistor $R_7$. The voltage at node 202 is equal to $V_{CC}$. Moreover, because switching element $S_2$ is turned on, the current from the current source flows through resistor $R_8$. The foregoing action creates a voltage drop across resistor $R_8$; therefore, the voltage at node 204 is lower than the voltage at node 202. The voltage levels at nodes 202 and 204 are shifted down through emitter followers $S_4,R_5$ and $S_5,R_6$. Consequently, a high voltage signal appears at +OUT and a low voltage signal appears at −OUT of the receiver 110.

As mentioned, the feedback circuit comprising switching elements $S_6$-$S_{10}$ and resistors $R_9$-$R_{11}$ is implemented to enhance the noise margin. In the feedback circuit, a constant current source comprises the switching element $S_{10}$, the resistor $R_{11}$, a controlling voltage $V_x$, and a biasing voltage $V_{EE}$. Moreover, the combination of the switching element $S_6$ and the resistor $R_9$ and the combination of the switching element $S_7$ and the resistor $R_{10}$ each serve as emitter followers. The functionality and interrelationship of the constant current source and the emitter followers is set forth below.

When a substantial positive voltage output +OUT (or, when +OUT > −OUT) indicating a logic high is generated by the differential current switch, the output voltage at outputs +OUT and −OUT is translated by the emitter followers to nodes 206 and 208, maintaining a higher voltage at node 206 than at node 208. As a consequence, switching element $S_8$ is turned on to provide a throughway between the current source $S_{10},R_{11}$ and the node 114 (−IN). Current from the current source flows through the resistors $R_1$ and $R_2$, causing the voltage to drop at the node 114. This serves to reinforce the original differential input voltage at inputs +IN and −IN, thus improving the noise margin.

Conversely, when a substantial negative voltage output −OUT (where −OUT > +OUT) indicating a logic low is generated by the differential current switch from a negative differential signal between inputs +IN and −IN (where −IN > +IN), the output voltage is used to trigger switching element $S_9$ in the feedback circuit. As a consequence, switching element $S_9$ is turned on to provide a throughway between the current source and the node 118. Current from the current source flows through resistor $R_3$ and causes the voltage at node 118 to drop. From a global perspective, the differential current switch is initially triggered by the differential voltage across resistor $R_0$, and then the feedback circuit reinforces that original input signal at the inputs +IN and −IN.

Table B, below, sets forth particular circuit element values for an exemplary implementation of FIG. 2. It should be noted that many other implementations are possible and are taught by the present invention.

TABLE B

| | |
|---|---|
| $Z_0$ = 50 ohms | $V_{CC}$ = 1.4 volts |
| $R_0$ = 50 ohms | $V_{EE}$ = −2.2 volts |
| $R_1 = R_2$ = 1.2K ohms | $V_R$ = 0 (GND) |
| $R_3$ = 450 ohms | $V_T$ = −0.7 volts |
| $R_4$ = 580 ohms | $V_X$ = −0.8 volts |
| $R_5 = R_6$ = 1.2K ohms | |
| $R_7 = R_8$ = 270 ohms | |
| $R_9 = R_{10}$ = 10K ohms | |
| $R_{11}$ = 2.5K ohms | |
| $S_1 - S_{10}$ = npn transistor with $\beta$ = approx. 100; $V_{be}$ of 0.8 volts at 1 milliampere of emitter current | |

Using the circuit element values set forth in Table B, the transceiver of the present invention can be operated at low power relative to any other known transceivers of like kind. The transceiver of the present invention operates with an average power consumption of approximately 30 milliwatts.

Furthermore, as a result of the feedback circuit in the novel receiver of the present invention the noise margin is increased, thereby facilitating the communication of logic states at the lower power levels. With feedback, the noise margin is nominally at about 220 millivolts.

While the present invention has been particularly shown and described with reference to the preferred embodiment and a specific implementation thereof, it will be understood by those skilled in the art that various changes in form and details may be made therein without departing from the spirit and scope of the present invention.

Having thus described our invention, what we claim as new and desire to secure by Letters Patent is:

1. A data bus transceiver, comprising:
   (a) a driver;
   (b) a resistor connecting said driver to one end of a communication line, said resistor having a resistance equivalent to the characteristic impedance of the communication line; and
   (c) a receiver having a differential current switch with two inputs, said differential current switch including means for comparing the signals at opposing ends of said resistor coupled to said two inputs to derive an output in accord with the logic state of a remote driver connected to the other end of said communication line, said differential current switch further comprises a constant current source alternatively switched by a signal differential across said resistor between (1) a first emitter follower configured to provide a non-inverted positive output and (2) a second emitter follower configured to provide an inverted negative output, wherein said positive and negative outputs define collectively the output of said differential current switch.

2. The transceiver of claim 1 further comprising a feedback circuit configured to provide feedback to said differential current switch, said feedback circuit comprising:
   a second constant current source alternatively switched between said two inputs of said differential current switch corresponding to the opposing ends of said resistor;
   a third emitter follower configured to provide an enhancement current to one of said two inputs when said positive output is greater than said negative output; and
   a fourth emitter follower configured to provide an enhancement current to the other of said two inputs when said negative output is greater than said positive output.

* * * * *